(12) United States Patent
Sharon

(10) Patent No.: US 12,146,904 B2
(45) Date of Patent: Nov. 19, 2024

(54) FAULT LOCATION SYSTEM USING VOLTAGE OR CURRENT MEASUREMENT FROM DIVERSE LOCATIONS ON A DISTRIBUTION NETWORK

(71) Applicant: S&C Electric Company, Chicago, IL (US)

(72) Inventor: Yoav Sharon, Evanston, IL (US)

(73) Assignee: S&C Electric Company, Chicago, IL (US)

( * ) Notice: Subject to any disclaimer, the term of this patent is extended or adjusted under 35 U.S.C. 154(b) by 106 days.

(21) Appl. No.: 17/834,974

(22) Filed: Jun. 8, 2022

(65) Prior Publication Data

US 2022/0308104 A1 Sep. 29, 2022

Related U.S. Application Data

(63) Continuation of application No. 16/827,077, filed on Mar. 23, 2020, now Pat. No. 11,378,609.
(Continued)

(51) Int. Cl.
*G01R 31/08* (2020.01)
*G01R 19/25* (2006.01)
(Continued)

(52) U.S. Cl.
CPC ....... *G01R 31/086* (2013.01); *G01R 19/2513* (2013.01); *G01R 21/003* (2013.01);
(Continued)

(58) Field of Classification Search
CPC .......... G01R 31/086; G01R 19/2513; G01R 21/003; G01R 27/16; G01R 31/085;
(Continued)

(56) References Cited

U.S. PATENT DOCUMENTS 5,198,746 A * 3/1993 Gyugyi ................. H02J 3/1814
363/39
10,436,831 B2 * 10/2019 Kang ................... G01R 31/085
(Continued)

OTHER PUBLICATIONS

International Search Report and Written Opinion for International Application No. PCT/US2020/024215 dated Jun. 16, 2020. (11 pages).

*Primary Examiner* — Farhana A Hoque
*Assistant Examiner* — Joseph O Nyamogo

(57) ABSTRACT

A method for identifying a location of a fault in an electrical power distribution network that includes identifying an impedance of an electrical line between each pair of adjacent utility poles, measuring a voltage and a current of the power signal at a switching device during the fault, and estimating a voltage at each of the utility poles downstream of the switching device using the impedance of the electrical line between the utility poles and the measured voltage and current during the fault. The method calculates a reactive power value at each of the utility poles using the estimated voltages, where calculating a reactive power value includes compensating for distributed loads along the electrical line that consume reactive power during the fault, and determines the location of the fault based on where the reactive power goes to zero along the electrical line.

16 Claims, 3 Drawing Sheets

Related U.S. Application Data

(60) Provisional application No. 62/823,117, filed on Mar. 25, 2019.

(51) Int. Cl.

| | |
|---|---|
| *G01R 21/00* | (2006.01) |
| *G01R 27/16* | (2006.01) |
| *G01R 31/62* | (2020.01) |
| *G01R 31/64* | (2020.01) |
| *H02H 3/40* | (2006.01) |
| *H02H 7/26* | (2006.01) |

(52) U.S. Cl.
 CPC ............ *G01R 27/16* (2013.01); *G01R 31/085* (2013.01); *G01R 31/62* (2020.01); *G01R 31/64* (2020.01); *H02H 3/40* (2013.01); *H02H 7/261* (2013.01); *Y04S 10/52* (2013.01)

(58) Field of Classification Search
 CPC .......... G01R 31/62; G01R 31/64; H02H 3/40; H02H 7/261; Y04S 10/52
 See application file for complete search history.

(56) References Cited

U.S. PATENT DOCUMENTS

| | | |
|---|---|---|
| 2007/0211401 A1 | 9/2007 | Mak |
| 2011/0264388 A1* | 10/2011 | Gong .................. G01R 31/088 702/58 |
| 2012/0203479 A1 | 8/2012 | Yodav et al. |
| 2012/0302271 A1 | 11/2012 | Stewart |
| 2016/0266193 A1 | 9/2016 | Ennis et al. |

* cited by examiner

FAULT LOCATION SYSTEM USING VOLTAGE OR CURRENT MEASUREMENT FROM DIVERSE LOCATIONS ON A DISTRIBUTION NETWORK

CROSS-REFERENCE TO RELATED APPLICATIONS

This application is continuation of prior U.S. application Ser. No. 16/827,077, filed Mar. 23, 2020, which claims the benefit of priority from the U.S. Provisional Application No. 62/823,117, filed on Mar. 25, 2019, the disclosure of which is hereby expressly incorporated herein by reference for all purposes.

BACKGROUND

Field

The present disclosure relates generally to a method for identifying the location of a fault in an electrical power distribution network and, more particularly, to a method for identifying the location of a fault in an electrical power distribution network that includes estimating the voltages at the utility poles downstream of a last recloser before the fault and compensating for distributed loads.

Discussion of the Related Art

An electrical power distribution network, often referred to as an electrical grid, typically includes a number of power generation plants each having a number of power generators, such as gas turbine engines, nuclear reactors, coal-fired generators, hydro-electric dams, etc. The power plants provide a high voltage AC signal on high voltage transmission lines that deliver electrical power to a number of substations typically located within a community, where the voltage is stepped down to a medium voltage. The substations provide the medium voltage power to a number of three-phase feeder lines. The feeder lines are coupled to a number of lateral lines that provide the medium voltage to various transformers, where the voltage is stepped down to a low voltage and is provided to a number of loads, such as homes, businesses, etc.

Periodically, faults occur in the distribution network as a result of various things, such as animals touching the lines, lightning strikes, tree branches falling on the lines, vehicle collisions with utility poles, etc. Faults may create a short-circuit that reduces the load on the network, which may cause the current flow from the substation to significantly increase, for example, up to 2500 amps, along the fault path. This amount of current causes the electrical lines to significantly heat up and possibly melt, and also could cause mechanical damage to various components in the substation and in the network.

Many times the fault will be a temporary or intermittent fault as opposed to a permanent or bolted fault, where the thing that caused the fault is removed a short time after the fault occurs, for example, a lightning strike, where the distribution network will almost immediately begin operating normally. Permanent faults need to be cleared so that electrical power can be restored to the section of the network experiencing the service outage. Temporary faults often need to be addressed to prevent the root cause of the fault from escalating into a permanent fault as well as increase the power quality and prevent wear on the equipment. This typically requires a field crew to identify the location of the fault and then make the repairs. Permanent faults can be eventually found by the field crew, however, the time it takes to find the fault can be considerable. Temporary faults are often very difficult to find, and utility companies may decide to ignore such faults until they escalate to permanent faults.

As mentioned, in order to clear a fault, the location of the fault must be identified. In order for a field crew or other personnel to identify the location of the fault, they need to know the general location of the fault in order to begin their search. Fault location systems for electric distribution networks do exist in the art, and typically rely on voltage and current measurements taken at a single location in the network, which is typically at a substation. These fault location systems also require the line impedance to be calculated in advance and provided by the utility company. However, such systems can result in large errors between the estimated fault location and the true fault location. Further, these systems may produce several candidate fault locations spread throughout the network. Thus, the value of known fault detection systems is limited in their ability to accurately identify the location of faults. What is needed is a fault location detection method for an electrical power distribution network that quickly and accurately identifies the location of a fault.

SUMMARY

The following discussion describes a method for identifying a location of a fault in an electrical power distribution network, where the network includes a power source, at least one electrical line, a number of spaced apart utility poles supporting the electrical line, and at least one switching device in the electrical line that is operable to prevent a power signal from flowing through the switching device in response to detecting the fault. The method includes identifying an impedance of the electrical line between each pair of adjacent utility poles downstream of the switching device, measuring a voltage and a current of the power signal at the switching device during the fault, but before the switching device prevents the power signal from flowing therethrough, and estimating a voltage at each of the utility poles downstream of the switching device using the impedance of the electrical line between the utility poles and the measured voltage and current during the fault. The method calculates a reactive power value at each of the utility poles using the estimated voltages, where calculating a reactive power value includes compensating for distributed loads along the electrical line that consume reactive power during the fault, and determines the location of the fault based on where the reactive power goes to zero along the electrical line.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a method for identifying a fault location in an electrical power distribution network is merely exemplary in nature, and is in no way intended to limit the invention or its applications or uses.

Figure 1:
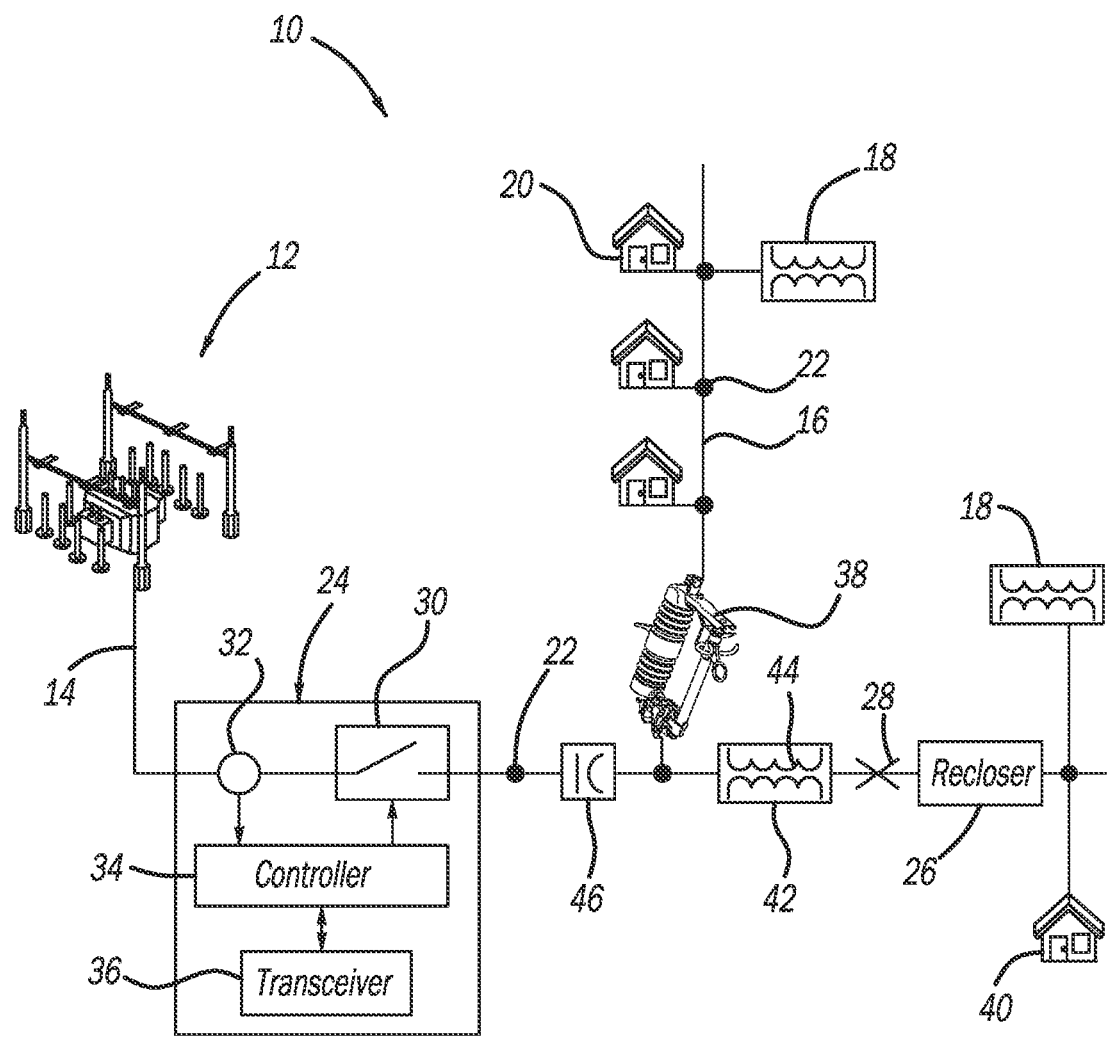
FIG. 1 is a simplified schematic illustration of an electrical power distribution network.

FIG. 1 is a schematic type diagram of an electrical power distribution network 10 including an electrical substation 12 that steps down high voltage power from a high voltage power line (not shown) to medium voltage power, a three-phase feeder line 14 that receives a medium voltage power signal from the substation 12, and a lateral line 16 that receives the medium voltage power signal from the feeder line 14. The medium voltage power signal is stepped down to a low voltage signal by a number of distribution transformers 18 strategically positioned along the lateral line 16, and the low voltage signal is then provided to a number of loads 20 represented here as homes. The network 10 also includes loads 20 connected to the feeder line 14 that are serviced by a distribution transformer 18.

The network 10 includes a number of reclosers of the type referred to above provided at certain intervals along the feeder line 14. In this example, the network 10 includes an upstream recloser 24 and a downstream recloser 26, where the upstream recloser 24 receives the medium voltage signal from the substation 12 on the feeder line 14 before the downstream recloser 26. Although only shown as a single line, the feeder line 14 would include three lines, one for each phase, where a separate recloser would be provided in each line. A number of utility poles 22 are provided along the feeder line 14 and the lateral line 16, where the reclosers 24 and 26 would be mounted on certain ones of the poles 22. The recloser 24 includes a relay or interrupter switch 30 for opening and closing the recloser 24 to allow or prevent current flow therethrough on the feeder line 14. The recloser 24 also includes a sensor 32 for measuring the current and voltage of the power signal propagating on the feeder line 14, a controller 34 for processing the measurement signals and controlling the position of the switch 30, and a transceiver 36 for transmitting data and messages to a control facility (not shown) and/or to other reclosers and components in the system 10. The recloser 26 would include the same or similar components as the recloser 24. The configuration and operation of reclosers of this type are well understood by those skilled in the art.

The lateral line 16 includes a fuse 38 positioned between the feeder line 14 and the first load 20 on the lateral line 16 proximate to a tap location where the lateral line 16 is connected to the feeder line 14. The fuse 38 is an independent electrical device that is not in communication with other components or devices in the network 10, where the fuse 38 creates an open circuit if an element within the fuse 38 heats up above a predetermined temperature as a result of high fault current so as to prevent short-circuit faults on the lateral line 16 from affecting other parts of the network 10. In order for voltage stability purposes, the voltage on the feeder line 14 and the lateral line 16 needs to be accurately controlled. For those locations in the network 10 where voltage corrections are necessary to boost the voltage to maintain voltage stability, a voltage regulator 42 is provided in the feeder line 14, which basically measures the voltage on the line 14 and employs a transformer 44 to boost the voltage if it drops below a predetermined value. Alternately, the voltage regulator 42 can convert medium voltage to low voltage, or instead of stepping down the voltage to the desired voltage level, it may step the voltage down to a value just above the desired voltage value. In addition to the voltage regulator 42, the power distribution network 10 also employs a capacitor 46 positioned on the feeder line 14 to help regulate the voltage thereon, where the capacitor 46 is a load that generates or supplies reactive power. Without the capacitor 46, all of the reactive power on the line 14 would be provided by the substation 12, where significant losses of the reactive power would occur the farther the load 20 is from the substation 12.

A fault location 28 is shown on the feeder line 14 between the reclosers 24 and 26, which creates a short-circuit or near short-circuit and thus a high fault current. The electrical path of a fault current includes all of the electrical wires and conductors between the substation 12 and the fault location 28. Along this fault path during the high fault current, the voltage of the power signal on the line 14 drops gradually from the substation 12 to the fault location 28, where the rate of voltage drop depends on the magnitude of the fault current and the impedance Z of the lines 14 and 16, and where the voltage on the line 14 at the fault location 28 meets certain conditions, for example, the line-to-ground voltage is zero for line-to-ground faults and the line-to-line voltage is zero for line-to-line faults.

From this understanding, fault location schemes have been devised in the art for calculating the possible locations of a fault on an electrical line by using the known impedance Z of the line and the voltage and current measurements provided by the reclosers along the fault path. Generally in these types of fault location schemes, the measured current before the fault occurs is used to determine the amount of load downstream of the recloser, and voltage measurements and estimations are used during the fault as discussed herein, which provides a general location of the fault within 50-100 milliseconds of the fault occurring. It is noted that the impedance Z of the line 14 or 16 may be different between the poles 22 depending on a number of factors, such as wire material, wire diameter, span length, height of the utility poles, etc., or the impedance Z could be the same or nearly the same for all of the spans between the poles 22. The reclosers 24 and 26 are able to communicate with each other so that the first recloser upstream of the fault location 28 is known to be the last recloser where the fault current and voltage can be measured, where that recloser can be opened so that power is still able to be provided upstream of it.

For the example shown in FIG. 1, the recloser 24 is the first upstream recloser from the fault location 28. Since the impedance Z of the feeder line 14 and the lateral line 16 are usually known for each span of the lines 14 and 16 between the utility poles 22 downstream of the recloser 24, the voltage and current can be estimated at each of the utility poles 22 using the measured voltage and current at the recloser 24 during the fault, where the voltage will continue to decrease to the fault location 28, where it will be at or near zero. Specifically, since the voltage $V_0$ and the current $I_0$ are measured at the recloser 24 during the fault, but before the switch 30 has opened, and the impedance Z of the feeder line 14 and the lateral line 16 is known in each span between the utility poles 22, the voltage at each utility pole 22 can be estimated as $V_1=V_0-Z_1I_0$, $V_2=V_1-Z_2I_0$, $V_3=V_2-Z_3I_0$, etc., where $V_1$ is the estimated voltage at the first utility pole 22 downstream from the recloser 24, $V_2$ is the estimated voltage at the second utility pole 22 downstream of the recloser 24, $V_3$ is the estimated voltage at the third utility pole downstream of the recloser 24, $Z_1$ is the impedance of the feeder line 14 between the recloser 24 and the first utility pole 22, $Z_2$ is the impedance of the feeder line 14 between the first and second utility poles, and $Z_3$ is the impedance of the feeder line 14 between the second and third utility poles. Thus, the voltage is estimated at each of the poles 22 in this manner until the estimated voltage begins to increase. Since the recloser 24 knows the locations of the utility poles 22 and their distances from the recloser 24, the general fault location 22 can be determined. It is noted that the impedance Z used in these calculations need not be overly precise because there is a comparison between two values that are computed based on the same impedance Z.

The above described method for determining the fault location 28 assumes that the fault is a direct short-circuit and has no impedance Z. However, a typical fault will not cause a direct short-circuit, and thus there will be some impedance Z at the fault location 28 that is all resistive, which acts to generate heat and create a voltage drop. Reactive power Q can be calculated at the recloser 24 using the equation $Q_0=\text{imag}(I_0*V_0)$, where $I_0$ and $V_0$ are complex numbers, * is a conjugate operator, and imag is the imaginary part of a complex number. The reactive power Q can be estimated at each of the utility poles 22 based on the estimated voltage determined above, specifically $Q_1=\text{imag}(I_0*V_1)$, $Q_2=\text{imag}(I_0*V_2)$, $Q_3=\text{imag}(I_0*V_3)$, etc. Since $I_0$ is the fault current, the reactive power calculations are valid as long as the pole 22 for which the reactive power Q is calculated is upstream of the fault location 28. At the fault location 28, the reactive power Q is calculated as zero since the fault only draws real power, and downstream of the fault location, the reactive power Q becomes negative. Since the fault may not be directly at a pole location, the estimated location will be in the span between the last pole 22 where the reactive power Q is positive and the first pole where the reactive power Q is negative.

Once the span between two of the utility poles 22 is identified as the location where the reactive power goes to zero and thus where the fault has occurred, then the following equation can be used to identify where in that span the fault actually is, where Q is the estimated reactive power at the last utility pole 22 before the fault location 28, I is the fault current, X is the inductive component of the line impedance Z, and l is the distance from the recloser 24 to the fault location 28.

$$Q=lX_{line/mile}I^2 \quad (1)$$

The voltage measured at the recloser 26 during the fault is basically the same as the voltage at the fault location 28, which is at or near zero. Because of the high sample rate, the downstream recloser 26 will see the voltage drop at the time that the fault occurs. As the fault current travels to the fault location 28 from the substation 12 the voltage drop at each of the utility poles 22 will be significant, but once the utility poles 22 are off of the fault path, then the voltage drop at each of the utility poles 22 will be minimal because the fault current is no longer present. Therefore, the downstream recloser 26 can provide a proximate voltage measurement at the fault location 28 if it is on the feeder line 14 or a proximate voltage measurement where the lateral line 16 connects to the feeder line 14 if the fault is on the lateral line 16.

For simplicity, the above discussion assumes that only one phase of the three-phase lines is faulted. The fault location method, however, is applicable for faults involving two or three phases. For example, with the voltage based approach, a phase-to-phase fault would be identified at the point where the phase-to-phase voltage is at or near zero. With the reactive power based approach, a phase-to-phase fault would be identified at the point where the sum of reactive power across all faulted phases is zero or negative.

Synchronized measurements from the downstream recloser 26 so that a phasor comparison can be made will lead to better performance. However, the fault location detection methods described herein do not assume synchronized measurements. In the absence of synchronized measurements, only the voltage magnitude can be compared. Alternatively, the angle difference can be estimated by comparing all three-phase voltages.

The fault location detection process based on impedance Z as discussed above has a number of disadvantages that may not allow the technique to accurately determine the fault location 28. For example, the process is susceptible to inaccuracies as a result of line impedance errors, loads on the network, taps from voltage regulators, sensor errors, harmonics, etc. Various solutions to some of these issues are discussed below.

The discussion above assumes that the fault location 28 acts as a resistive element to ground where there is only a small amount of real power and no reactive power, as discussed. However, in reality there are typically loads, represented by load 40, downstream of the fault location 28 that consume both real and reactive power so that they are drawing some reactive power at the fault location 28 during the fault. In addition, when power goes through an inductor there is loss of reactive power, and those loads 20 that are upstream of the fault location 28 also are consuming reactive power when the fault occurs. Hence, in order to provide a more accurate determination of the fault location 28 based on the location where the reactive power goes to zero in the line 14, a load compensation factor needs to be employed to compensate for the upstream loads 20 and the downstream loads 40 that consume reactive power during the fault. However, the power draw of the loads 20 and 40 is not an available value that could be used to provide load compensation to more accurately identify the fault location 28. Therefore, the load compensation factor would need to be determined based on how much power goes through the recloser 24 before the fault and during the fault, where the measurement of the power before the fault is used to estimate how much power the loads 20 and 40 are consuming downstream of the recloser 24 during the fault.

The present disclosure describes a technique for calculating the load compensation factor by measuring the power flow through the upstream recloser 24 before the fault occurs and during the fault. Before the fault occurs, all of the power from the recloser 24 is used to power the loads 20 and 40 downstream of the recloser 24. When the fault occurs, and the voltage drops along the feeder line 14, the loads 20 and 40 will behave differently as a result of that voltage drop. In order to estimate the reactive power draw of the loads 20 and 40 during the fault so that that it can be removed from the calculation of the reactive power to identify the fault location 28, it is necessary to determine whether the measured voltage at the recloser 24 during the fault is used or the voltage at the fault location 28 is used to determine how much load is connected to the line 14 during the fault. In other words, it is necessary to determine how much of the fault current is being used to power the loads 20 during the fault, where that amount of current can then be removed from the estimation of the voltage at the poles 22 that is used to identify where the reactive power goes to zero to determine the location 28 of the fault.

According to one embodiment, the load compensation technique determines how much load is connected to each of the utility poles 22 that includes a transformer 18, which is provided by the utility, but is not available at every point in time. However, the utility does provide the size of each transformer 18 in the network 10, where it is assumed that the size or rating of the transformer 18 is based on the amount of load it needs to support. More particularly, the size of the distribution transformers 18 would depend on the size and number of the loads 20 it serves, where the larger the load 20, the higher the rating of the transformer 18. When a fault occurs, a graph search of all of the transformers 18 downstream of the recloser 24 is performed and the size of those transformers 18 is added up to obtain a cumulative transformer size, which provides an estimate of the amount of power flowing through the recloser 24 before the fault. Once the cumulative transformer size is obtained, then a utilization ratio is determined that is a prefault power $P_{prefault}$ divided by the cumulative transformer size, which determines an average of how much power each of the transformers 18 is drawing before the fault, where the prefault power $P_{prefault}$ is the power calculated by the recloser 24 based on the current and voltage measurements before the fault.

For each pole 22 that includes a distribution transformer 18, a nominal load power is then determined as the utilization ratio times the size of the transformer 18 on that pole 22. Next, the voltage is estimated at every pole 22 during the fault using the measured current and impedance Z in the manner discussed above. Then, equation (2) below is used to determine a fault load power $P_{fault}$ during the fault at each pole 22 that includes a transformer 18.

$$P_{fault} = \left(\frac{v_{fault}}{v_{nominal}}\right)^n P_{prefault}, \quad (2)$$

where $v_{fault}$ is the estimated voltage at the fault location 28 during the fault, $v_{nomimal}$ is the voltage at the recloser 24 before the fault, and n is an exponential that is determined by experimentation, where n=2 for a constant impedance, n=1 for a constant current and n=0 for constant power.

The load power $P_{fault}$ during the fault is divided by the voltage calculated at that pole 22 to obtain the current going to the loads 20 serviced by that pole 22. Therefore, for each estimation of the voltage at each of the poles 22, instead of using the current $I_0$ for calculating that estimation as discussed above, the amount of current drawn by the loads 20 upstream of the pole 22 is subtracted from the current $I_0$ in a cumulative manner as the estimation of the voltage at each pole continues downstream of the recloser 24 to more accurately identify the location 28 of the fault. More particularly, the reactive power Q is calculated at each of the poles 22 in the manner discussed above as Q=imag(($I_0$*−$I_c$*)V), where $I_c$ is the cumulative current servicing the loads 20 at that pole 22 and the loads 20 upstream of that pole 22 during the fault. This process is also performed for the loads 40 downstream of the fault location 28.

As mentioned the capacitor 46 provides a large contribution of reactive power at a particular location in the network 10, which also needs to be compensated for when determining the fault location 28. This compensation can also be provided by the fault power $P_{fault}$ in equation (2) as the capacitor 46 is well characterized, where the value n can be determined, and thus the voltage dependency of the capacitor 46 can be readily calculated. The capacitor 46 will also be positioned on one the utility poles 22, and therefore the power draw by the capacitor 46 can be removed from the measured current $I_0$ as part of cumulative removal of the current in addition to the transformers 18 in the manner discussed above.

Sometimes the capacitor 46 may be switched off because lower load demands do not require as much power, where the reactive power Q generated by the capacitor 46 is returned to the substation 12. For example, during the daytime and evening hours when the power demand is usually high, the utility may turn on the capacitor 46 to deliver the desired reactive power to the loads 20, and then may turn off the capacitor 46 at night time when the demand is low to save cost and provide efficiency. However, the state of the capacitor 46 is not known to the recloser 24 because there is no communication therebetween.

The fault location detection scheme discussed above may identify multiple possible fault locations on the various lines depending on how they are configured. More particularly, the number of the utility poles 22 and the spans therebetween will be different depending on whether the fault is on a certain one of the lines, where multiple general fault locations may be identified. However, a proximate distance from the recloser 24 to the fault location can be provided regardless of what line the fault is on. Further, the voltage measured by the downstream recloser 26 will be approximately the same as the voltage at the location where the fault is occurring if it is on the feeder line 14 or the voltage at the location that the fault current last occurred on the feeder line 14 if the fault is on the lateral line 16. As will be discussed in detail below, the present disclosure proposes employing multiple reclosers that measure voltage and current to eliminate possible fault locations that are not the actual fault location.

Figure 2:
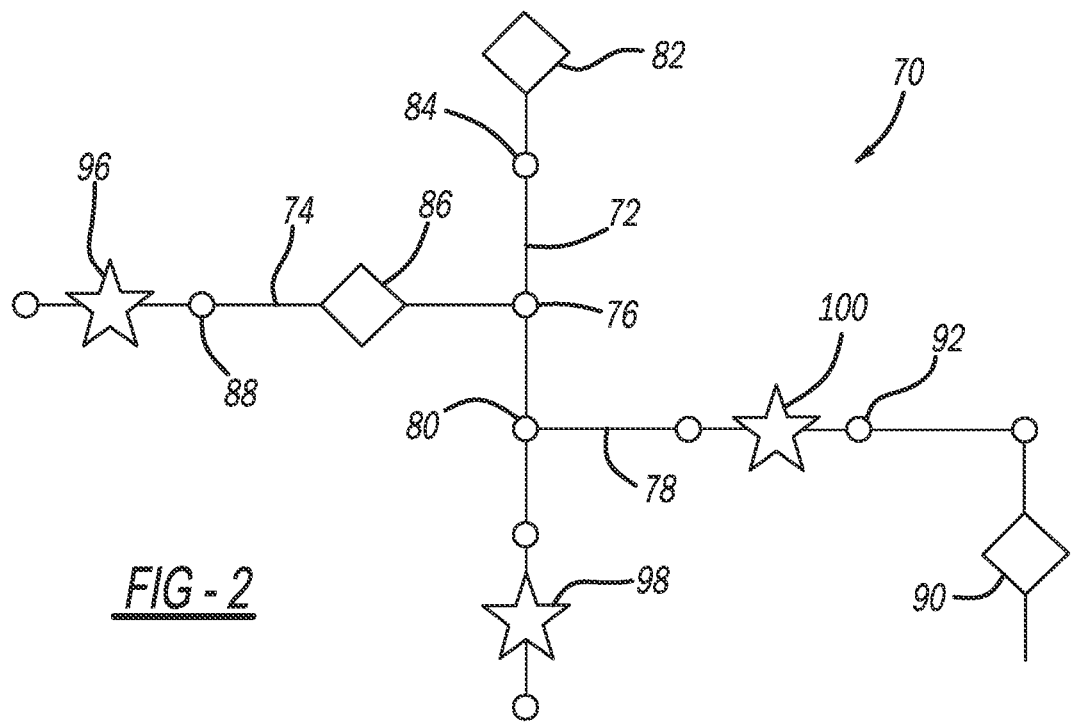
FIG. 2 is an illustration of an electrical power distribution network including one recloser on an electrical line with a fault and another recloser on an electrical line connected to the line with the fault.

FIG. 2 is a simple illustration of an electrical power distribution network 70 illustrating this embodiment of the disclosure. The network 70 includes a main electrical line 72, a secondary line 74 tapped off of the main line 72 at tap location 76 and a secondary line 78 tapped off of the main line 72 at tap location 80. The main line 72 includes a recloser 82 and a number of utility poles 84, the secondary line 74 includes a recloser 86 and a number of utility poles 88, and the secondary line 78 includes a recloser 90 and a number of utility poles 92.

By using the voltage estimation process at each of the poles discussed above to determine the location of a fault by employing the impedance of the lines 72, 74 and 78, the process could identify locations 96, 98 and 100 as possible fault locations, where in this example, the fault location 98 is the actual location of the fault. For this specific example, the recloser 82 measures the fault current when the fault occurs, but the reclosers 86 and 90 would not measure the fault current because they are not on the fault path, namely, the line 72. When the fault occurs, the recloser 86 on the line 74 is upstream of the possible fault location 96, but does not measure a fault current because it is not on the fault path, and thus, it is known that the location 96 is not the actual fault location. However, because the recloser 90 is downstream of the possible fault location 100, that location cannot be immediately eliminated as the actual fault location even though it will not measure the fault current because it is not on the fault path.

The voltage at the tap location 80 can be estimated based on the measurement of the current and voltage at the recloser 82 during the fault and the line impedance Z between the poles 84 in the manner discussed above. If the fault is at the fault location 98, then the current measured by the recloser 90 will be much less than the fault current, and if the fault is at the location 100, then the current measured by the recloser 90 during the fault will be near zero, but still measureable. These different current measurements depending on whether the fault is at location 98 or 100 can be used to estimate the voltages at the poles 84 and 92 using the known impedance values by the recloser 90 in the manner discussed above to help identify the location of the fault. The voltage at the tap location 80, the last pole 84 before the fault location 98 and the poles 92 on both sides of the fault location 100 can be estimated by both of the reclosers 82 and 90 and those various voltages can be compared to each other. If the voltages estimated by the reclosers 82 and 90 is the same at the tap location 80, then it is known that the fault location 98 is the actual fault location. However, if the voltage calculated by the reclosers 82 and 90 is the same at the location 100, then that is the actual fault location.

Often times the impedance Z of the line provided by the utility is not accurate and thus will not give accurate voltage estimations at the poles for determining fault locations as discussed above. According to one embodiment of the disclosure, the current and voltage measured by the reclosers 24 and 26 during the fault can be used to provide a more accurate estimate of the impedance Z of the feeder line 14 therebetween, and that estimation of the impedance Z can be compared to the impedance Z of the line 14 provided by the utility company to determine its accuracy. An error between the calculated impedance Z and the given impedance Z can be used to more accurately determine the location 28 of the fault by correcting the given impedance Z of the line 14 downstream of the recloser 24 where the voltages are estimated. For example, if the calculation of the line impedance Z between the reclosers 24 and 26 determines that the calculated impedance Z and the given impedance Z has an error of 10%, that 10% correction can then be used in the calculations discussed above when estimating the voltage at the poles 22, which gives a more accurate location of the fault based on when the voltage goes to zero or near zero, where the impedance Z is given typically in ohms per mile.

Figure 3:
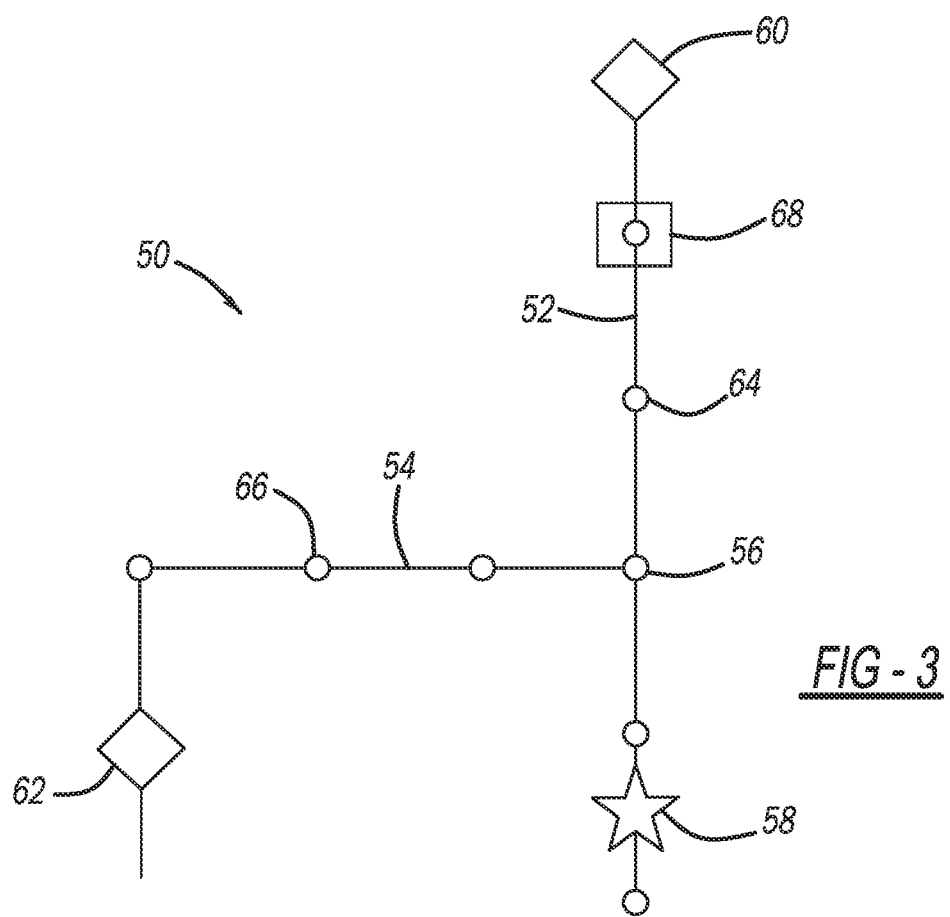
FIG. 3 is an illustration of an electrical power distribution network including a first recloser on an electrical line with a fault, a second recloser on an electrical line connected to the line with the fault, and a third recloser on another electrical line connected to the line with the fault.

FIG. 3 is a simple illustration of an electrical power distribution network 50 that illustrates the impedance Z correction embodiment for providing a more accurate determination of a fault location. The network 50 includes a first electrical line 52 and a second electrical line 54 connected to the first line 52 at a tap location 56, where a fault has occurred at location 58 in the line 52, and where the lines 52 and 54 can be feeder lines or lateral lines. A recloser 60 is provided in the first line 52 upstream from the fault location 58 and a recloser 62 is provided in the second line 54, and is not on the fault path. A number of utility poles 64 are provided in the line 52 and a number of utility poles 66 are provided in the line 54.

Because the fault is not located in the lines 52 and 54 between the reclosers 60 and 62, the impedance Z of the lines in that section of the network 50 can be accurately determined because the measured voltage and current are provided at the reclosers 60 and 62. The voltage on the line 52 will significantly decrease from the recloser 60 to the tap location 56 during the fault and the recloser 62 will measure that voltage during the fault. The voltage is estimated by the recloser 60 at the tap location 56 in the manner discussed above using the given impedance Z, and that voltage is compared to the voltage measured by the recloser 62 during the fault, where the difference in the estimated voltage and the measured voltage is a result of an error of the impedance Z in the line 52 used to estimate the voltage at each pole 64. In other words, because the impedance between adjacent poles 64 and adjacent poles 66 is provided, and the voltage is measured at the recloser 60 and the recloser 62, the estimation of the voltage at the tap location 56 can be used to provide the error that identifies a correction for the impedance. The voltage measured by the recloser 62 minus the estimated voltage at the last pole 64 before the fault location 58 is equal to the current measured by the recloser 62 times the impedance Z in the line 54 between the recloser 62 and the tap location 56. Therefore, the impedance Z of the line 52 can be corrected in the line 52 after the tap location 56 based on the actual impedance calculation and that correction can be applied to the section of the line 52 between the tap location 56 and the fault location 58.

If a voltage regulator 68 is provided in the line 52 downstream of the recloser 60, but upstream of the fault location 58, the estimates of the voltage downstream of the voltage regulator 68 may no longer be accurate, and corrections need to be made in order to more accurately determine the location 58 of the fault. By comparing the voltage at the tap location 56 to the measured voltage at the recloser 62 will allow the recloser 60 to know how much the voltage regulator 68 has stepped up the voltage, which can be employed in the voltage estimation calculations downstream of the tap location 56. Further, it is possible to use the comparison of those two voltages to identify whether the difference in the voltages is a result of the error in the impedance Z or caused by the increase in voltage provided by the voltage regulator 68.

Figure 4:
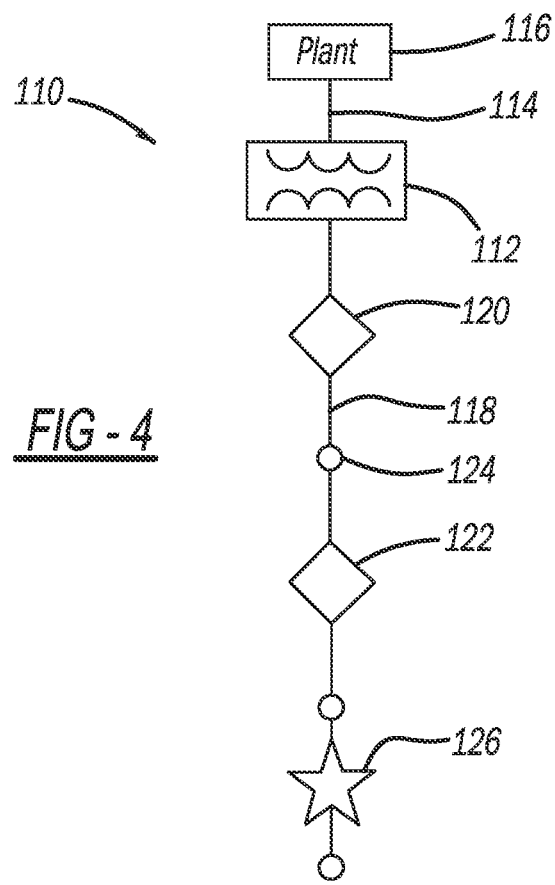
FIG. 4 is an illustration of an electrical power distribution network including two reclosers and a transformer on an electrical line with a fault.

The present disclosure also describes a technique for identifying the location of a fault if the impedance Z of the feeder line 14 between the poles 22 is not known. FIG. 4 is a simple illustration of a distribution network 110 illustrating this embodiment. The network 110 includes a transformer 112 that represents the large power transformer in the substation 12 that steps down the high voltage on transmission line 114 from a power plant 116 on the transmission side of the transformer 112 to a medium voltage on line 118 on the distribution side of the transformer 112, where the voltage on the transmission side does not change as a result of faults that may occur on the distribution side. A first recloser 120 and a second recloser 122 are provided in the line 118 and utility poles 124 are provided along the line 118, where a fault location 126 is identified downstream of the recloser 122. The voltage and current are measured by the reclosers 120 and 122 and the voltages are estimated at the downstream poles 124 from the reclosers 120 and 122 during the fault in the manner discussed above, where the voltage measured by the reclosers 120 and 122 before the fault is the same or almost the same as the voltage on the transmission line 114. From these measurements, the impedance $Z_1$ of the line 118 between the substation 112 and the first recloser 120 and the impedance $Z_2$ of the line 118 between the substation 112 and the second recloser 122 can be determined as:

$$Z_1 = \frac{V_{ld} - V_{ft1}}{I_{ft}}, \qquad (3)$$

$$Z_2 = \frac{V_{ld} - V_{ft2}}{I_{ft}}, \qquad (4)$$

where $V_{ld}$ is the voltage on the transmission line 114, $V_{f1}$ is the voltage measured by the recloser 120 during the fault, $V_{f2}$ is the voltage measured by the recloser 122 during the fault, and $I_{fl}$ is the fault current measured by the reclosers 120 and 122.

The impedances $Z_1$–$Z_2$ are subtracted to get the impedance of the line 118 between the reclosers 118 and 120, and that value is divided by the distance between the reclosers 118 and 120 to give an impedance Z per distance, such as per mile or per kilometer. Therefore, that impedance Z per distance can be assumed to be the same for the line 116 downstream of the recloser 122, and the location of the fault 124 can be determined by estimating the voltage at each pole 124 downstream of the recloser 122 until the reactive power goes to zero in the manner discussed above. If the impedance of the transformer 112 is known, then only a single one of the reclosers 120 or 122 is needed in the line 116 to estimate the impedance Z per distance, where the impedance Z calculated by equation (3) is subtracted from the transformer impedance to obtain that value.

Figure 5:
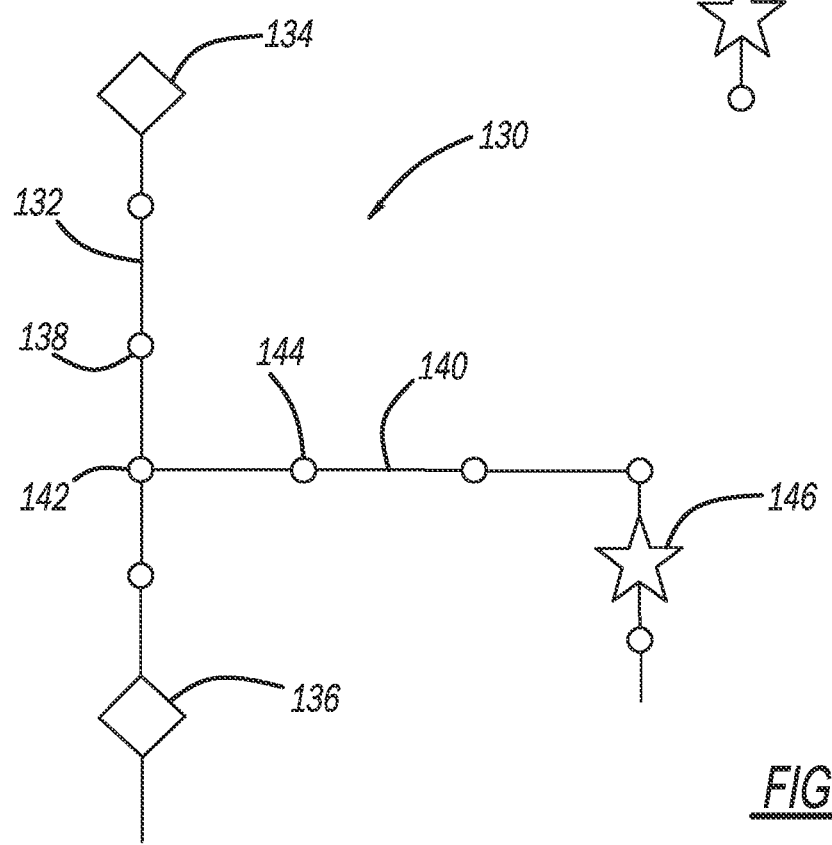
FIG. 5 is an illustration of an electrical power distribution network including two reclosers on an electrical line without a fault and an electrical line with a fault connected to the line without the fault.

FIG. 5 is a simple illustration of a distribution network 130 illustrating the case where the location of a fault can be identified without knowing the line impedance, where the fault is on a line that does not include a recloser. The network 130 includes a feeder line 132 having a first recloser 134 and a second recloser 136 and including a number of utility poles 138. A secondary or lateral line 140 is tapped from the line 132 at tap location 142, and includes utility poles 144, where the fault is at location 146 on the line 140. In this example, the voltage at the tap location 142 during the fault is the same or nearly the same as the voltage measured by the second recloser 136 during the fault. The impedance Z of the section of the line 132 between the first recloser 134 and the tap location 142 can then be determined as voltage $V_1$ measured by the recloser 134 during the fault minus voltage $V_2$ measured by the recloser 136 during the fault divided by the fault current I as ($Z=(V_1-V_2)/I$). Since the distance from the recloser 134 to the tap location 142 is known, the impedance Z per distance can be obtained, and that value can be used to obtain the location 146 of the fault by estimating the voltage at each pole 124 downstream of the recloser 134 until the reactive power goes to zero in the manner discussed above.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for identifying a location of a fault in an electrical power distribution network, the network including a power source, at least one electrical line, a number of spaced apart utility poles supporting the at least one electrical line, and at least one switching device in the electrical line, the at least one switching device being operable to prevent a power signal from flowing through the switching device in response to detecting the fault, the method comprising:
   determining an impedance of the at least one electrical line between each pair of adjacent utility poles downstream of the at least one switching device;
   estimating a voltage and a current of the power signal in the at least one switching device during the fault, but before the switching device prevents the power signal from flowing therethrough;
   estimating a voltage at each of the utility poles downstream of the at least one switching device using the impedance of the electrical line between the utility poles and the measured voltage and current during the fault;
   calculating a reactive power value at each of the utility poles using the estimated voltages, wherein calculating a reactive power value includes compensating for distributed loads along the electrical line that consume reactive power during the fault by estimating the reactive power that the distributed loads consume based on a cumulative power rating size of a plurality of distribution transformers that provide power to the distributed loads downstream of the at least one switching device; and
   determining the location of the fault based on where the reactive power value goes to zero along the at least one electrical line.

2. The method of claim 1, wherein determining an impedance of the at least one electrical line comprises determining an impedance of the at least one electrical line between the at least one switching device and a second switching device.

3. The method of claim 2, wherein determining an impedance of the at least one electrical line comprises determining a difference between a first impedance in the at least one electrical line from a source to the at least one switching device and a second impedance from the source to the second switching device.

4. The method of claim 1, wherein determining an impedance of the at least one electrical line comprises determining an impedance of the at least one electrical line from the at least one switching device to a tap location.

5. The method of claim 1, wherein determining an impedance of the at least one electrical line from the at least one switching device to a tap location comprises determining a first voltage at the at least one switching device during a fault event and determining a second voltage at a second switching device on the at least one electrical line during the fault event.

6. The method of claim 5, wherein determining an impedance of the at least one electrical line from the at least one switching device to a tap location comprises determining a difference between the first voltage and the second voltage.

7. The method according to claim 1 wherein determining the cumulative power rating size of the transformers includes doing a graph search of all of the transformers downstream of the at least one switching device, and adding the sizes together.

8. The method according to claim 1 wherein compensating for the distributed loads includes determining a prefault power value from a measured current and voltage by the at least one switching device before the fault, determining a utilization ratio that is the prefault power value divided by the cumulative transformer size, calculating a nominal load power value at each of the utility poles that includes a transformer as the utilization ratio multiplied by the size of the transformer on that pole, using the estimated voltage and the nominal load power value at the pole to determine a fault load power value during the fault, dividing the fault load power value by the estimated voltage to obtain a current draw value at the pole, and cumulatively reducing the current that is used to estimate the voltage at each pole based on the current draw value used to supply the loads.

9. The method according to claim 8 wherein determining the fault load power value during the fault includes using the equation:

$$P_{fault} = \left(\frac{v_{fault}}{v_{nominal}}\right)^n P_{prefault}$$

where $P_{fault}$ is the fault load power value, $P_{prefault}$ is the prefault power value, $v_{fault}$ is the measured voltage at the fault location during the fault, $v_{nominal}$ is the voltage before the fault, and n is an exponential that is determined by experimentation, where n=2 for constant impedance, n=1 for constant current and n=0 for constant power.

10. The method according to claim 1 wherein calculating a reactive power value includes compensating for a capacitor provided in the electrical line downstream of the at least one switching device that provides reactive power on the electrical line.

11. The method according to claim 10 wherein compensating for the capacitor includes calculating a fault power at the capacitor.

12. The method according to claim 1 wherein estimating the voltage at each pole includes using the equation:

$$Q = \text{imag}(I^*V)$$

where Q is reactive power, I is the measured fault current and V is the estimated voltage.

13. The method according to claim 1 wherein identifying the fault location includes identifying the location of the fault in a span between utility poles using the equation:

$$Q = lX_{line/mile}I^2$$

where Q is the estimated reactive power at the last utility pole before the fault location, I is the fault current, X is the inductive component of the line impedance Z, and l is the distance from the at least one switching device to the fault location.

14. The method according to claim 1 wherein the power source is an electrical substation and the electrical power distribution network is a medium voltage power distribution network.

15. The method according to claim 1 wherein the at least one switching device is a recloser.

16. The method according to claim 1 wherein the at least one electrical line is one phase of three-phase lines in a feeder line.

* * * * *